(12) United States Patent
Kim et al.

(10) Patent No.: US 6,882,187 B1
(45) Date of Patent: Apr. 19, 2005

(54) LINE DRIVING CIRCUIT

(75) Inventors: Hyunbae Kim, Fremont, CA (US);
Chen Yu Wang, San Jose, CA (US);
Kuang-Yu Chen, Saratoga, CA (US)

(73) Assignee: Silego Technology, Inc., Santa Clara, CA (US)

( * ) Notice: Subject to any disclaimer, the term of this patent is extended or adjusted under 35 U.S.C. 154(b) by 0 days.

(21) Appl. No.: 10/628,078

(22) Filed: Jul. 25, 2003

(51) Int. Cl.[7] .................................................. H03B 1/00
(52) U.S. Cl. ...................... 327/112; 327/170; 327/391; 326/83; 326/87
(58) Field of Search .......................... 327/108–112, 170, 327/389, 391; 326/26, 27, 83, 87

(56) References Cited

U.S. PATENT DOCUMENTS

| | | | | |
|---|---|---|---|---|
| 5,859,552 A | * | 1/1999 | Do et al. ................... 327/170 |
| 5,959,473 A | * | 9/1999 | Sakuragi ................... 327/112 |
| 6,078,169 A | * | 6/2000 | Petersen ................... 323/273 |
| 6,184,730 B1 | | 2/2001 | Kwong et al. ............. 327/112 |
| 6,359,478 B1 | * | 3/2002 | Chow ........................ 327/112 |

* cited by examiner

*Primary Examiner*—Long Nguyen
(74) *Attorney, Agent, or Firm*—Van Pelt & Yi LLP

(57) ABSTRACT

A line driver and a method for driving a line are disclosed. The line driver includes a first current device configured to initiate a change in the state of the line and a second current device configured to substantially complete the change. The first current device provides a first current and the second current device provides a second current that is smaller than the first current.

9 Claims, 7 Drawing Sheets

LINE DRIVING CIRCUIT

FIELD OF THE INVENTION

The present invention relates generally to line driving circuits. More specifically, a line driver that includes a first current device configured to initiate a change in the state of a line and a second current device configured to substantially complete the change is disclosed.

BACKGROUND OF THE INVENTION

A line driving circuit, or line driver, sources or sinks current to or from a circuit in order to change the state of the circuit. For purposes of explanation, sinking current will be referred to extensively. It should be understood where the current sink portion of the line driving circuit is described, that a corresponding current source structure in the current source portion is also included. Line driving circuits may be used in a memory module or buffer. Typically, such a circuit must source or sink current to change the state of the various devices that comprise the memory module or other device driven through a buffer. FIG. 1A is a circuit diagram illustrating a typical existing implementation of a line driving circuit.

The line driving circuit includes an input line with input voltage 105, an output line with output voltage 115, a PMOS transistor 101, and an NMOS transistor 103. The input line is connected to the gates of PMOS transistor 101 and NMOS transistor 103. The drain of transistor 101, the drain of transistor 103, and the output line are connected. The source of PMOS transistor 101 is connected to the high rail. The source of NMOS transistor 103 is connected to the low rail. Current 107 flows through PMOS transistor 101. Current 109 flows through NMOS transistor 103.

FIG. 1B is a plot illustrating current 109 vs. output voltage 115 for line driving circuit 1A. When line driving circuit 1A transitions from sourcing to sinking current, NMOS transistor 103 passes current 109 and drives down output voltage 115. Conversely, when line driving circuit 1A transitions from sinking to sourcing current, input voltage PMOS transistor 101 passes current 107 and drives up output voltage 115. Currents 107 and 109 are limited in size by their saturation levels.

FIG. 1C is a plot illustrating output voltage 115 vs. time when line driving circuit 1A transitions from sourcing to sinking current. The undesirable effects of cross-coupling, impedance matching, and overshoot and undershoot on the waveform are illustrated in the plot, and are discussed in the following paragraphs. Note that this plot may appear differently, depending on the phenomena present at any given time.

Capacitance or other interaction between output lines of the line driving circuit may cause cross-coupling. As a greater number of lines are driven, the effect of cross-coupling is increased. Cross coupling can cause an effect referred to as "push out," where output voltage 115 increases slightly when it should be decreasing and vice versa. One approach that has been suggested for reducing push out is to increase the size of transistors 101 and 103. This has the effect of decreasing the impedance of transistors 101 and 103, which are coupled by the other switching lines. The decreased impedance helps counteract any effects caused by cross-coupling.

Increasing the size of transistors 101 and 103 may cause an impedance mismatch with the load. Impedance mismatch between the line driver and the circuit being driven may cause reflection. Impedance matching is a particular problem just before the output line reaches steady state during a state transition.

Overshoot and undershoot are another problem that may be caused by increasing the size of transistors 101 and 103. Overshoot and undershoot occur just when the output line is driven beyond the voltage desired for the new state being achieved by a state transition. For example, as line driving circuit 1A transitions from sourcing to sinking current, current 109 is initially large. As steady state is approached, output voltage 115 will tend to overshoot or undershoot due to the difficulty of suddenly restricting current 109 from a large to flow to substantially no flow.

It would be desirable to develop a design that would ameliorate cross-coupling, provide good impedance matching and prevent overshoot and undershoot.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

Figure 1A:
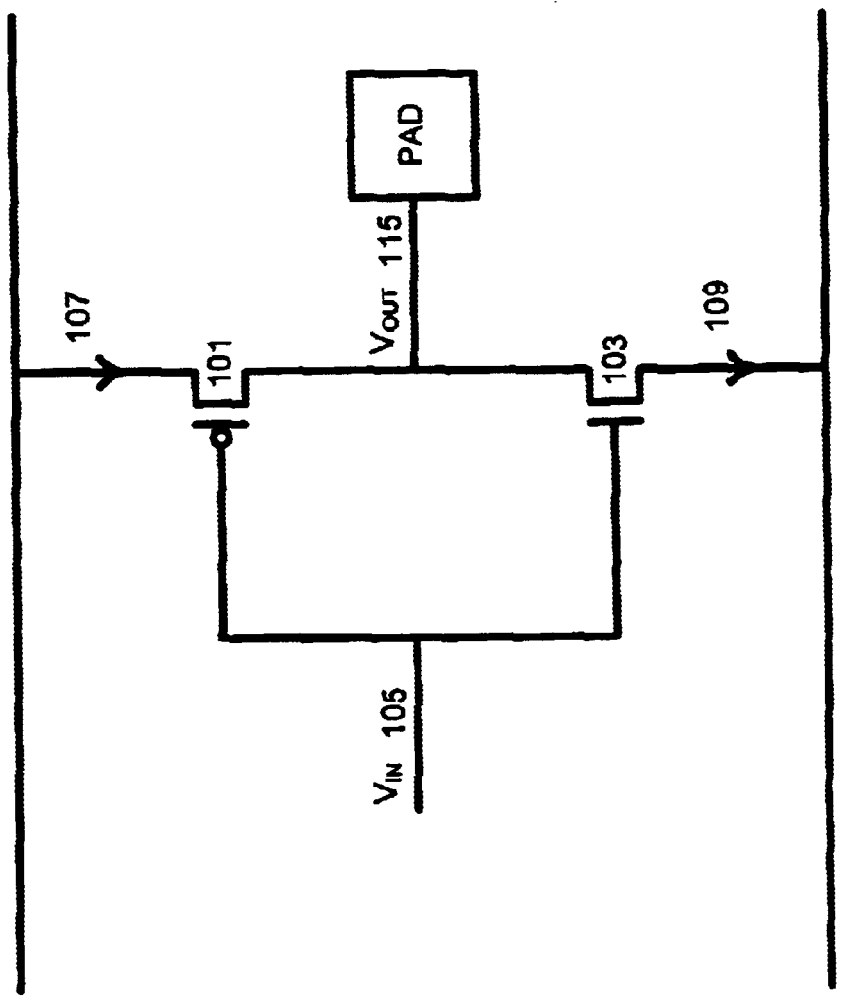
FIG. 1A is a circuit diagram illustrating a typical existing implementation of a line driving circuit.
Figure 1B:
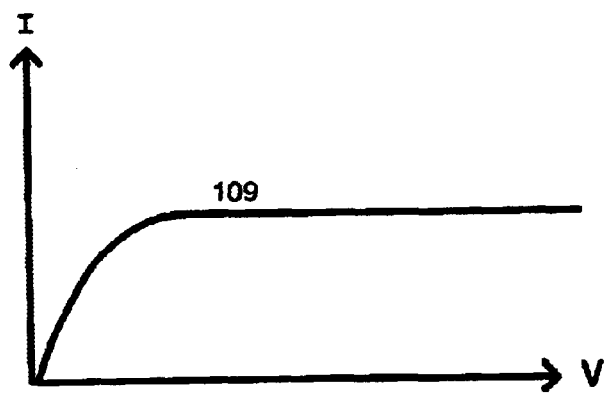
FIG. 1B is a plot illustrating current 109 vs. output voltage 115 for line driving circuit 1A.
Figure 1C:
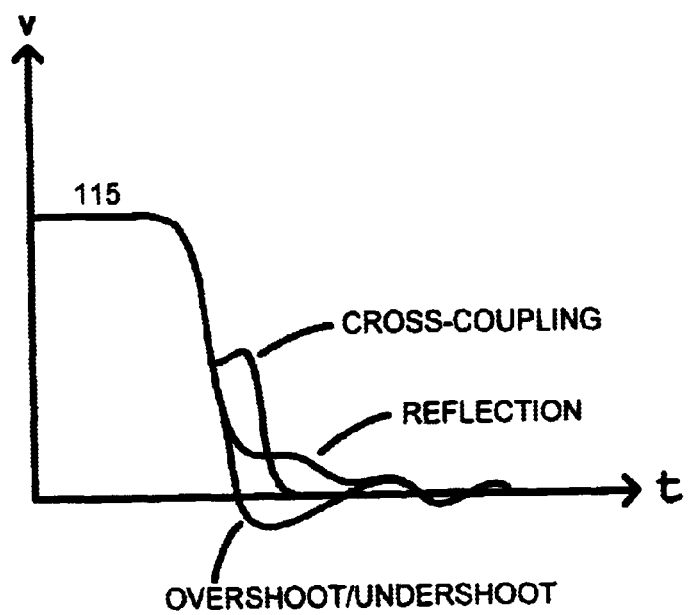
FIG. 1C is a plot illustrating output voltage 115 vs. time when line driving circuit 1A transitions from sourcing to sinking current.

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

An improved line driver is disclosed. The line driver sources or sinks current. A current source or sink is referred to as a current device. The line driver includes a first current device that provides a first current and a second current device that provides a second current that is smaller than the first current. In one embodiment, the second current is less than 20% of the first current. In other embodiments, the second current could be less than 10% or less than 1% of the first current. The first current device is configured to initiate a change in the state of the line. The second current device is configured to substantially complete the change.

In some embodiments, the first current device continues to provide current as the second current device substantially completes the change in the state of the line. Similarly, the second current device may provide current as the first current device initiates the change in the state of the line. In other embodiments, the first current device provides substantially no current as the second current device substantially completes the change in the state of the line. Similarly, the second current device may provide substantially no current as the first current device initiates the change in the state of the line.

In the embodiments discussed below, the line driver includes transistors that are used to source or sink currents. In general, the line driver and the transistors that comprise the line driver are sized appropriately for the circuit that is to be driven. When transistors or current are referred to as being large or small, that is meant to indicate their relative size within the given line driver.

As the state of the line is changed, the large current device initially provides a large current to overwhelm any effects of cross-coupling and enhance the switching speed. Any change in the voltage of the line caused by cross-coupling is reduced by the large current implementing the desired state change. Then the switching device substantially limits the large current device, leaving the small current device to complete the change in state of the line. The smaller current at the completion of the change mitigates problems with impedance matching, overshoot and undershoot.

Figure 2A:
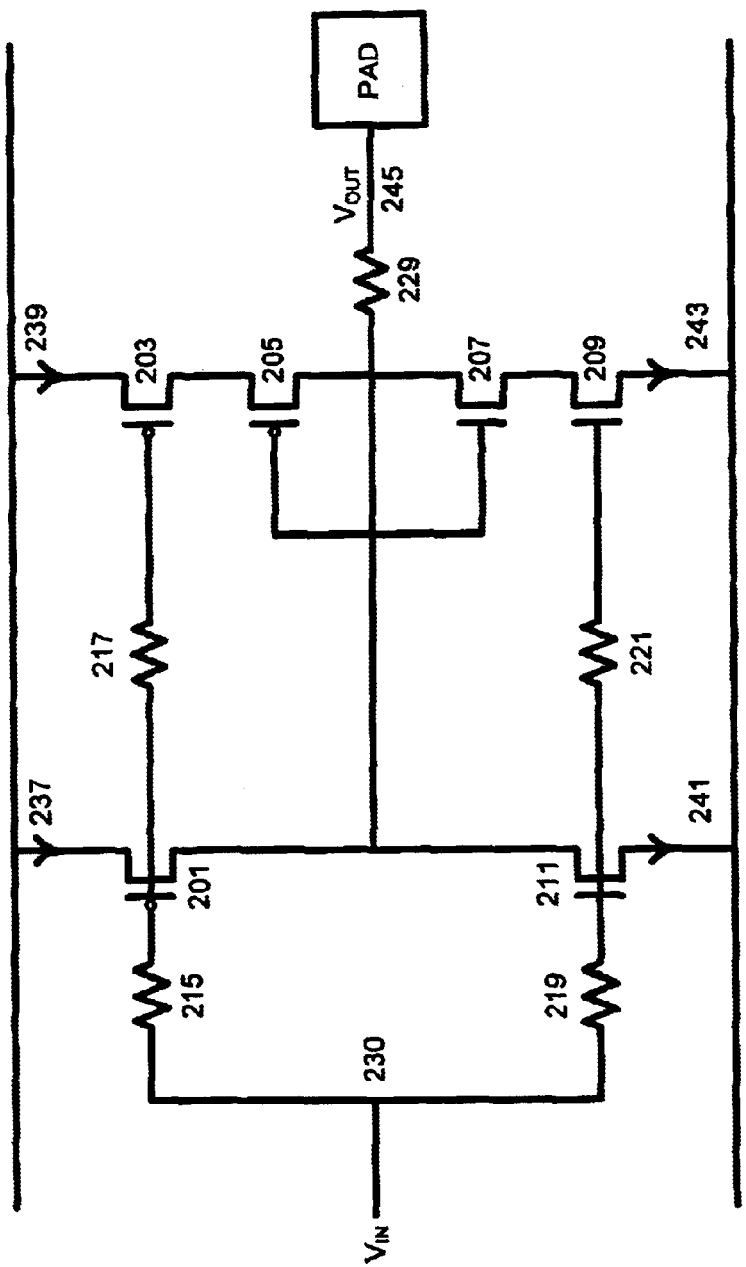
FIG. 2A is a circuit diagram illustrating a typical implementation of an improved line driving circuit.

FIG. 2A is a circuit diagram illustrating a typical implementation of an improved line driving circuit.

The NMOS side of the circuit includes a small transistor 211, a large transistor 209, a diode-configured transistor 207, and resistors 219 and 221. The NMOS side of the circuit is connected as follows: Small transistor 211 is a small transistor capable of passing a small current 241. Resistor 219 is connected between the input and the gate of small transistor 211. Input voltage 230 is the input voltage. Resistor 221 is connected between the gate of small transistor 211 and the gate of large transistor 209. Large transistor 209 is capable of passing a large current 243. The drain of large transistor 209 is connected to the source of transistor 207. The gate and drain of transistor 207 are connected, so that transistor 207 is configured as a diode. The drain of transistor 211 is connected to the gate of transistor 207. Resistor 229 is connected between the gate of transistor 207 and the output. The sources of small transistor 211 and large transistor 209 are connected to the low rail. Output voltage 245 is the output voltage.

The PMOS side of the circuit is a mirror image of the NMOS side. The PMOS side of the circuit includes a small transistor 201, a large transistor 203, a diode-configured transistor 205, and resistors 215 and 217. Small transistor 201 is a small transistor capable of passing a small current 237. Resistor 215 is connected between the input and the gate of small transistor 201. Resistor 217 is connected between the gate of small transistor 201 and the gate of large transistor 203. Large transistor 203 is capable of passing a large current 239. The drain of large transistor 203 is connected to the source of transistor 205. The gate and drain of transistor 205 are connected, so that transistor 205 is configured as a diode. The drain of transistor 201 is connected to the gate of transistor 205. The sources of small transistor 201 and large transistor 203 are connected to the high rail. Resistor 229 is connected between the gate of transistor 205 and the output.

Resistors 215, 217, 219, 221, and 229 are selected to bias the transistors in an appropriate manner. In some embodiments, some of the resistors may not be required.

In this embodiment, on the NMOS side, large transistor 209 comprises the large current device. Small transistor 211 comprises the small current device. Diode-configured transistor 207 comprises the switching device. On the PMOS side, large transistor 203 comprises the large current device. Small transistor 201 comprises the small current device. Diode-configured transistor 205 comprises the switching device.

The NMOS side of the circuit during a state transition operates as follows. When the circuit first transitions from sourcing to sinking current, diode-configured transistor 207 turns on and large transistor 209 passes a large current. Any tendency of output voltage 245 to fluctuate up as a result of cross-coupling is counteracted by large current 243 driving output voltage 245 down. As the output voltage is driven lower, the voltage drop across diode-configured transistor 207 becomes insufficient to turn on the diode, current-limiting large transistor 209. Small transistor 211 passes a small current 241. Transistor 211 is sized such that the impedance of the circuit matches that of the load (typically 60 ohms), hence avoiding an impedance matching problem that may exist just before the output line reaches steady state. Additionally, voltage overshoot and undershoot are mitigated because the circuit switches to a small current once diode-configured transistor 207 shuts off.

The PMOS side of the circuit follows an analogous description. When the circuit first transitions from sinking to sourcing current, diode-configured transistor 205 turns on and large transistor 203 passes a large current. Any tendency of output voltage 245 to fluctuate down as a result of cross-coupling is counteracted by large current 239 driving output voltage 245 up. As the output voltage is driven higher, the voltage drop across diode-configured transistor 205 becomes insufficient to turn on the diode, current-limiting large transistor 203. Small transistor 201 passes a small current 237. Transistor 201 is sized such that the impedance of the circuit matches that of the load (typically 60 ohms), hence avoiding the impedance matching problem that may exist just before the output line reaches steady state. Additionally, voltage overshoot and undershoot are mitigated because the circuit switches to a small current once diode-configured transistor 205 shuts off.

Figure 2B:
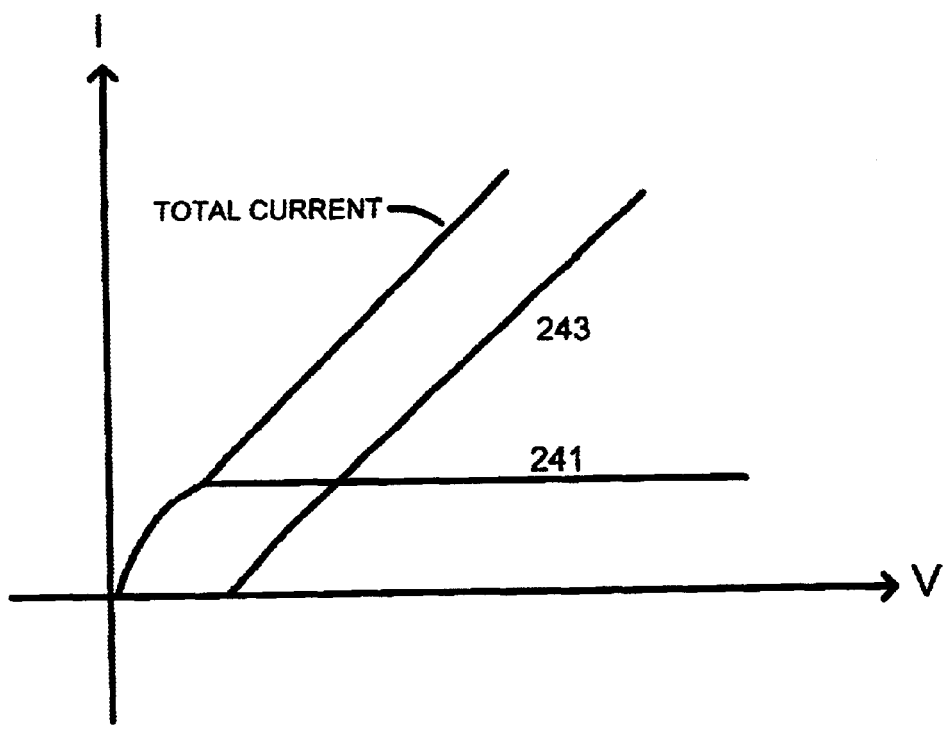
FIG. 2B is a plot illustrating small current 241, large current 243, and the total current vs. output voltage 245.

FIG. 2B is a plot illustrating small current 241, large current 243, and the total current vs. output voltage 245. When the improved line driving circuit transitions from sourcing to sinking current, output voltage 245 is initially high. The total current is high due to large current 243. As output voltage 245 is driven down, large current 243 is limited, leaving small current 241 to complete the change in state.

Other Embodiments of the Improved Line Driving Circuit

Other embodiments of the circuit include replacing transistors 205 and 207 with resistors or diodes, though a diode-configured transistor is preferred over a diode for ease of manufacture. Replacing transistors 205 and 207 with resistors current limits large transistors 203 and 209, which may be desirable in some embodiments.

Figure 3:
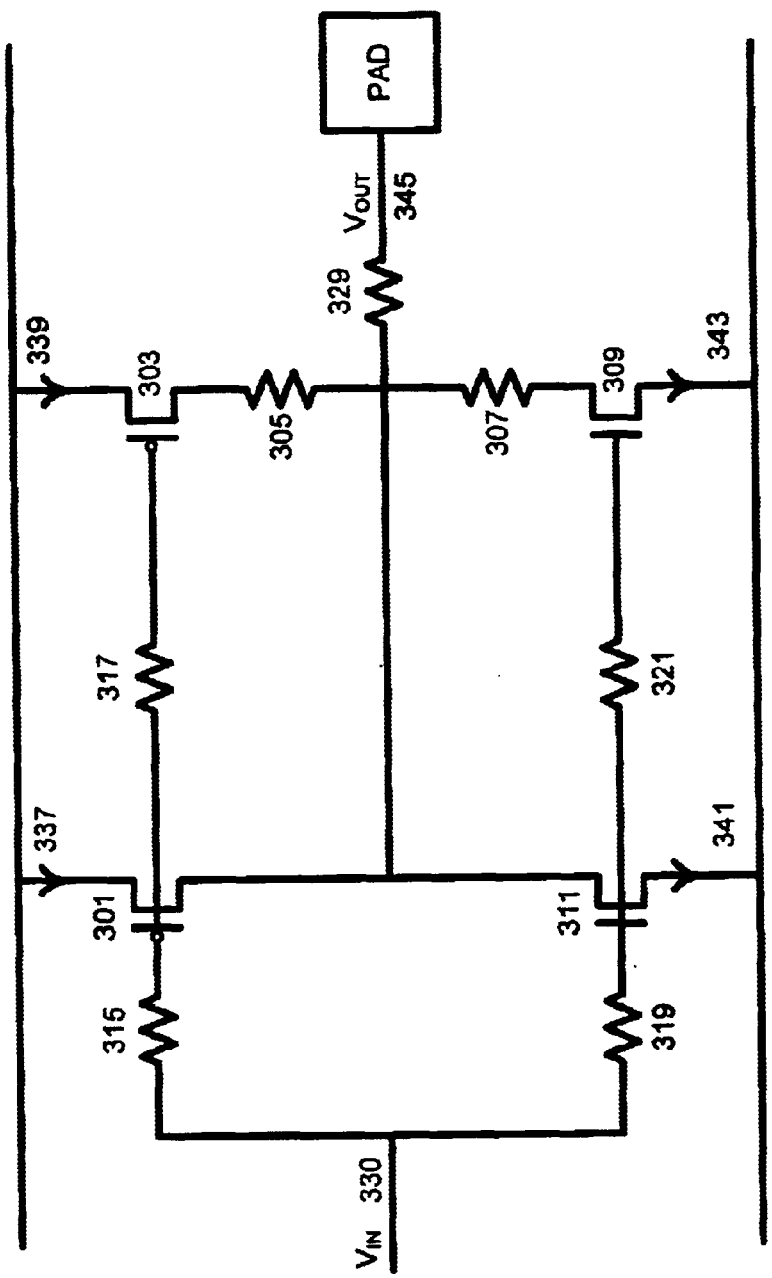
FIG. 3 is a circuit diagram illustrating an example of such an embodiment of the improved line driving circuit.

FIG. 3 is a circuit diagram illustrating an example of such an embodiment of the improved line driving circuit.

The NMOS side of the circuit includes a small transistor 311, a large transistor 309, and resistors 307, 319 and 321. The NMOS side of the circuit is connected as follows: Small transistor 311 is a small transistor capable of passing a small current 341. Resistor 319 is connected between the input and the gate of small transistor 311. Input voltage 330 is the input voltage. Resistor 321 is connected between the gate of small transistor 311 and the gate of large transistor 309. Large transistor 309 is capable of passing a large current 343. Resistor 307 connects the drain of large transistor 309 with the drain of small transistor 311. Resistor 329 is connected between the drain of small transistor 311 and the output. The sources of small transistor 311 and large transistor 309 are connected to the low rail. Output voltage 345 is the output voltage.

The PMOS side of the circuit is a mirror image of the NMOS side. The PMOS side of the circuit includes a small transistor 301, a large transistor 303, and resistors 305, 315 and 317. Small transistor 301 is a small transistor capable of passing a small current 337. Resistor 315 is connected between the input and the gate of small transistor 301. Resistor 317 is connected between the gate of small transistor 301 and the gate of large, transistor 303. Large transistor 303 is capable of passing a large current 339. Resistor 305 connects the drain of large transistor 303 with the drain of small transistor 301. Resistor 329 is connected between the drain of small transistor 301 and the output. The sources of small transistor 301 and large transistor 303 are connected to the high rail.

Resistors 305, 307, 315, 317, 319, 321, and 329 are selected to bias the transistors in an appropriate manner. In some embodiments, some of the resistors may not be required.

In this embodiment, on the NMOS side, large transistor 309 comprises the large current device. Small transistor 311 comprises the small current device. Resistor 307 comprises the switching device. On the PMOS side, large transistor 303 comprises the large current device. Small transistor 301 comprises the small current device. Resistor 305 comprises the switching device.

Alternate Line Driving Circuit

Figure 4A:
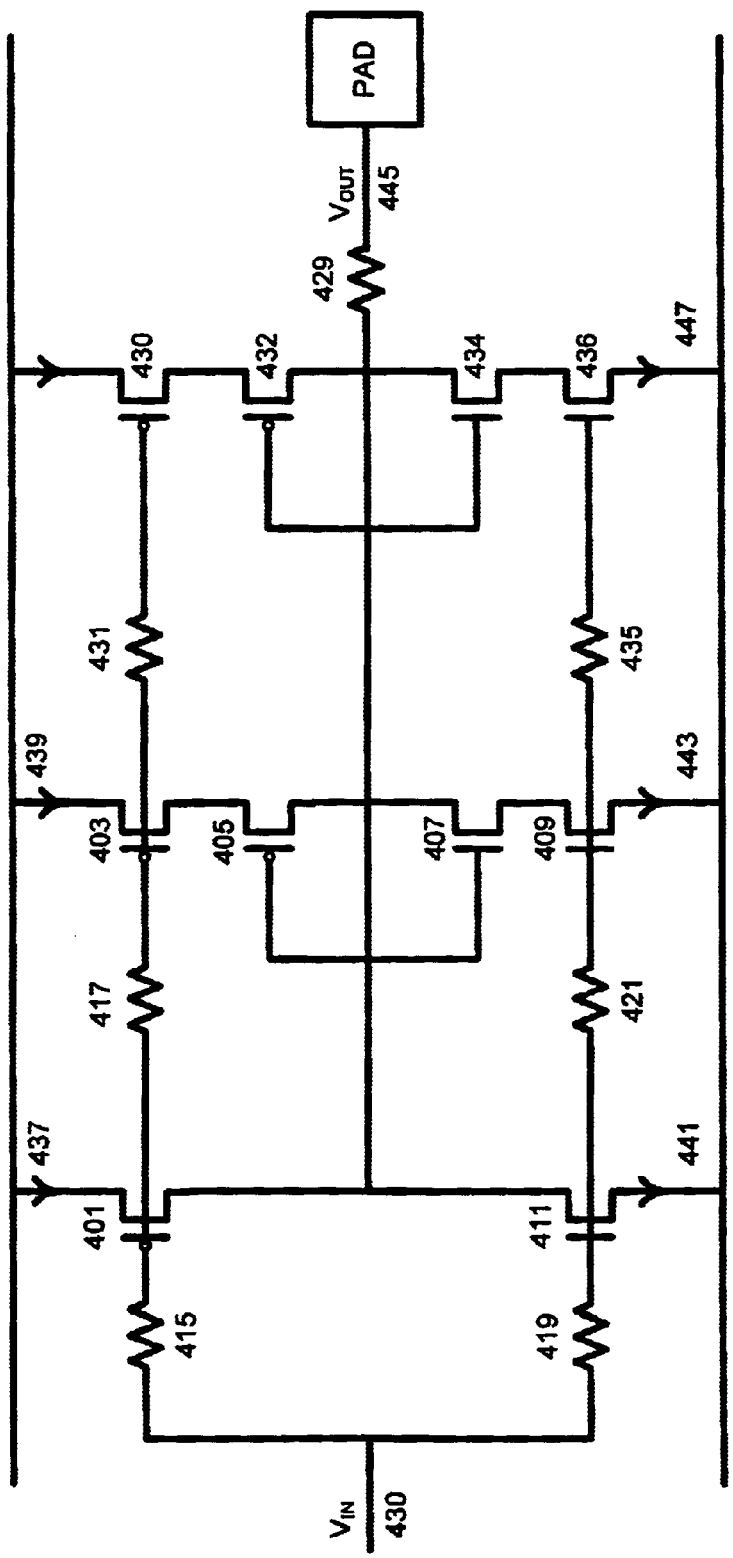
FIG. 4A is a circuit diagram illustrating an alternate embodiment of the improved line driving circuit.

FIG. 4A is a circuit diagram illustrating an alternate embodiment of the improved line driving circuit. This embodiment provides more robust current sinking and may be desirable for some applications, such as high frequency (200–300 MHz) applications.

The NMOS side of the circuit includes a small transistor 411, a transistor 409, a diode-configured transistor 407, and resistors 419 and 421. The NMOS side of the circuit is connected as follows: Small transistor 411 is a small transistor capable of passing a small current 441. Resistor 419 is connected between the input and the gate of small transistor 411. Input voltage 430 is the input voltage. Resistor 421 is connected between the gate of small transistor 411 and the gate of transistor 409. Transistor 409 is capable of passing a current 443. The drain of transistor 409 is connected to the source of transistor 407. The gate and drain of transistor 407 are connected, so that transistor 407 is configured as a diode. The drain of transistor 411 is connected to the gate of transistor 407. Resistor 429 is connected between the gate of transistor 407 and the output. The sources of small transistor 411 and transistor 409 are connected to the low rail. Output voltage 445 is the output voltage.

The NMOS side of the circuit also includes diode-configured transistor 434, transistor 436, and resistor 435. Resistor 435 is connected between the gate of transistor 409 and the gate of transistor 436. The drain of transistor 436 is connected to the source of transistor 434. The gate and drain of transistor 434 are connected so that transistor 434 is configured as a diode. The gate of diode-configured transistor 434 is connected to the gate of diode-configured transistor 407. The source of transistor 436 is connected to the low rail.

The PMOS side of the circuit is a mirror image of the NMOS side. The PMOS side of the circuit includes a small transistor 401, a transistor 403, a diode-configured transistor 405, and resistors 415 and 417. Small transistor 401 is a small transistor capable of passing a small current 437. Resistor 415 is connected between the input and the gate of small transistor 401. Resistor 417 is connected between the gate of small transistor 401 and the gate of transistor 403. Transistor 403 is capable of passing a current 439. The drain of transistor 403 is connected to the source of transistor 405. The gate and drain of transistor 405 are connected, so that transistor 405 is configured as a diode. The drain of transistor 401 is connected to the gate of transistor 405. The sources of small transistor 401 and transistor 403 are connected to the high rail. Resistor 429 is connected between the gate of transistor 405 and the output.

The PMOS side of the circuit also includes diode-configured transistor 432, transistor 430, and resistor 431. Resistor 431 is connected between the gate of transistor 403 and the gate of transistor 430. The drain of transistor 430 is connected to the source of transistor 432. The gate and drain of transistor 432 are connected so that transistor 432 is configured as a diode. The gate of diode-configured transistor 432 is connected to the gate of diode-configured transistor 405. The source of transistor 430 is connected to the high rail.

Resistors 415, 417, 419, 421, 429, 431, and 435 are selected to bias the transistors in an appropriate manner. In some embodiments, some of the resistors may not be required.

In this embodiment, on the NMOS side, transistors 409 and 436 comprise the large current device small transistor 411 comprises the small current device. Diode-configured transistors 407 and 434 comprise the switching device. On the PMOS side, transistors 403 and 430 comprise the large current device. Small transistor 401 comprises the small current device. Diode-configured transistors 405 and 432 comprise the switching device.

The NMOS portion of the circuit is described. An analogous description can be made for the PMOS portion of the circuit. This circuit is similar to the one depicted in FIG. 2A with an additional diode-transistor series pair and resistor stacked on to the output. The stack includes diode-configured transistor 434, transistor 436, and resistor 435. The additional stack provides an additional current sink to drive down the output. An advantage of this embodiment is evident from the peak response of currents 443 and 447. Peak response refers to the current vs. time plot as the line driver changes from sourcing to sinking current. Current 447 has a time shifted peak response from current 443. The time shifted peak response may result from resistor 435. This results in a widening of the total current's peak response. Thus there is a greater time period when there is a larger current driving down the circuit.

Figure 4B:
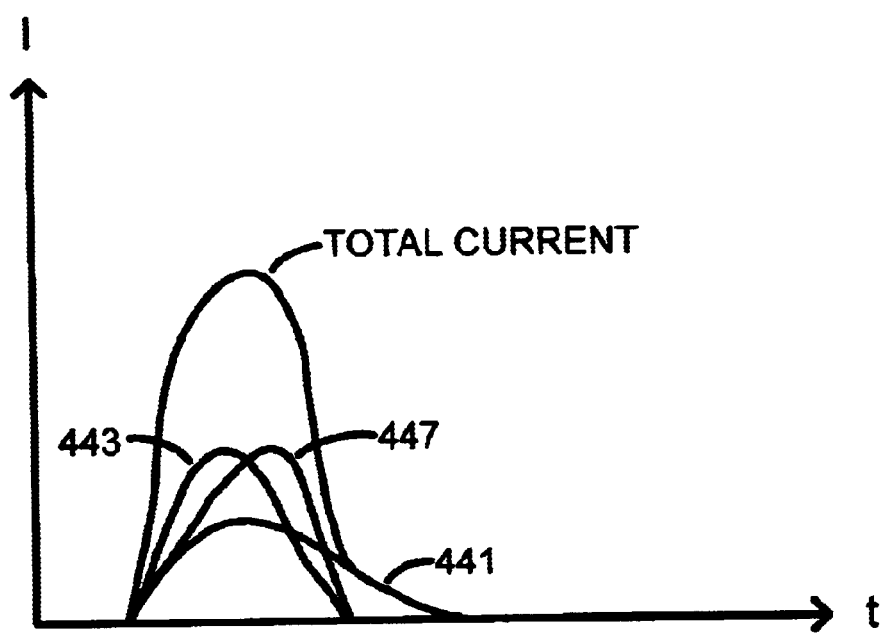
FIG. 4B is a plot illustrating small current 441, currents 443 and 447, and the total current vs. time for the alternate line driving circuit 4A.

FIG. 4B is a plot illustrating small current 441, currents 443 and 447, and the total current vs. time for the alternate line driving circuit 4A. The plot illustrates these currents as the state of the line driver changes from sourcing to sinking current. The total current's peak response is widened because the peaks corresponding to currents 443 and 447 are offset in time. This results in a greater time during which there is a larger total current driving down the output.

Other Embodiments of the Alternate Line Driving Circuit

Other embodiments of the alternate line driving circuit described above include replacing any of transistors 405, 407, 432, and 434 with resistors or diodes, though a diode-configured transistor is preferred over a diode for ease of manufacture. Replacing transistors 405 and 407 with resistors current limits transistors 403 and 409, which may be desirable in some embodiments. Replacing transistors 432 and 434 with resistors current limits transistors 430 and 436, which may be desirable in some embodiments.

In other embodiments of the alternate line driving circuit, additional stacks can be added to create additional parallel current sinks. The sizes of the transistors that comprise the large current device are such that the peak current through the large current device is larger than the current through the small current device. If there are enough additional stacks, a transistor that is part of the large current device may be smaller than the transistor in the small current device.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A line driver for driving a line having a state including:
   a first current device configured to initiate a change in the state of the line, wherein the first current device includes a plurality of current devices connected in parallel, wherein each of the plurality of current devices comprising a semiconductor device for generating a first current; and
   a second current device configured to substantially complete the change, wherein the second current device provides a second current that is smaller than the first current; and
   wherein each of the plurality of current devices further comprising a diode configured to limit the first current as the state of the line is changing.

2. A line driver for driving a line having a state as recited in claim 1 wherein the first and second current devices are current sources.

3. A line driver for driving a line having a state as recited in claim 1 wherein the first and second current devices are current sinks.

4. A line driver for driving a line having a state as recited in claim 1 wherein the semiconductor device includes a transistor sized to provide the first current.

5. A line driver for driving a line having a state as recited in claim 1 wherein the semiconductor device includes a first transistor sized to provide the first current and wherein the second current device includes a second transistor sized smaller than the first transistor to provide the second current that is smaller than the first current.

6. A line driver for driving a line having a state as recited in claim 1 wherein the diode includes a diode-configured transistor.

7. A line driver for driving a line having a state as recited in claim 1 wherein one of the plurality of current devices has a peak response that is time shifted with respect to one of the other of the plurality of current devices.

8. A line driver for driving a line having a state as recited in claim 1 wherein a resistor is connected between the input to a first of the plurality of current devices and the input to a second of the plurality of current devices so that the first of the plurality of current devices has a peak response that is time shifted with respect to the second of the plurality of current devices.

9. A method of driving a line having a state including:
   initiating a change in the state of the line using a first current device, wherein the first current device includes a plurality of current devices connected in parallel, wherein each of the plurality of current devices comprising a semiconductor device for generating a first current; and
   substantially completing the change using a second current device, wherein the second current device provides a second current that is smaller than the first current;
   wherein each of the plurality of current devices further comprising a diode configured to limit the first current as the state of the line is changing.

* * * * *